(12) United States Patent
Von Ammon et al.

(10) Patent No.: US 6,887,775 B2
(45) Date of Patent: May 3, 2005

(54) PROCESS AND APPARATUS FOR EPITAXIALLY COATING A SEMICONDUCTOR WAFER AND EPITAXIALLY COATED SEMICONDUCTOR WAFER

(75) Inventors: Wilfried Von Ammon, Hochburg/Ach (AT); Ruediger Schmolke, Burghausen (DE); Peter Storck, Mehring (DE); Wolfgang Siebert, Mehring (DE)

(73) Assignee: Siltronic AG, Munich (DE)

( * ) Notice: Subject to any disclaimer, the term of this patent is extended or adjusted under 35 U.S.C. 154(b) by 88 days.

(21) Appl. No.: 10/387,593

(22) Filed: Mar. 13, 2003

(65) Prior Publication Data

US 2003/0219981 A1 Nov. 27, 2003

(30) Foreign Application Priority Data

Mar. 14, 2002 (DE) .......................................... 102 11 312

(51) Int. Cl.$^7$ ............................................. H01L 21/205
(52) U.S. Cl. ........................ 438/607; 438/513; 438/980; 438/913; 438/928
(58) Field of Search .............................. 438/222, 226, 438/413, 416, 513, 607, 680, 913, 928, FOR 237, FOR 386, FOR 484

(56) References Cited

U.S. PATENT DOCUMENTS

| 5,679,405 A | 10/1997 | Thomas et al. |
| 5,960,555 A | 10/1999 | Deaton et al. |
| 6,652,650 B2 * | 11/2003 | Yang et al. ................... 117/200 |
| 6,746,787 B2 * | 6/2004 | Naito et al. ................... 428/698 |
| 2002/0069818 A1 * | 6/2002 | Naito et al. ................... 117/109 |
| 2003/0041799 A1 * | 3/2003 | Yang et al. ................... 117/200 |

FOREIGN PATENT DOCUMENTS

| EP | 0714998 | 6/1996 |
| EP | 0792954 | 9/1997 |
| EP | 0953659 | 11/1999 |
| WO | 90/13687 | 11/1990 |
| WO | 01/86034 | 11/2001 |
| WO | 01/86035 | 11/2001 |

* cited by examiner

*Primary Examiner*—George Fourson
*Assistant Examiner*—Joannie Adelle Garcia
(74) *Attorney, Agent, or Firm*—Collard & Roe, P.C.

(57) ABSTRACT

A process for epitaxially coating the front surface of a semiconductor wafer in a CVD reactor, the front surface of the semiconductor wafer being exposed to a process gas which contains a source gas and a carrier gas, and the back surface of the semiconductor wafer being exposed to a displacement gas, wherein the displacement gas contains no more than 5% by volume of hydrogen, with the result that diffusion of dopants out of the back surface of the semiconductor wafer, which is intensified by hydrogen, is substantially avoided. With this process, it is possible to produce a semiconductor wafer with a substrate resistivity of $\leq 100$ m$\Omega$cm and a resistivity of the epitaxial layer of $>1$ $\Omega$cm without back-surface coating, the epitaxial layer of which semiconductor wafer has a resistance inhomogeneity of $<10\%$.

9 Claims, 3 Drawing Sheets

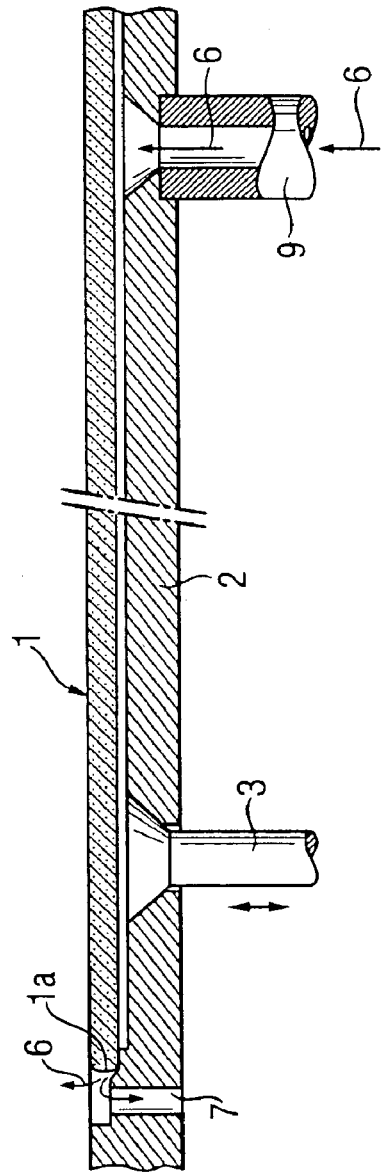
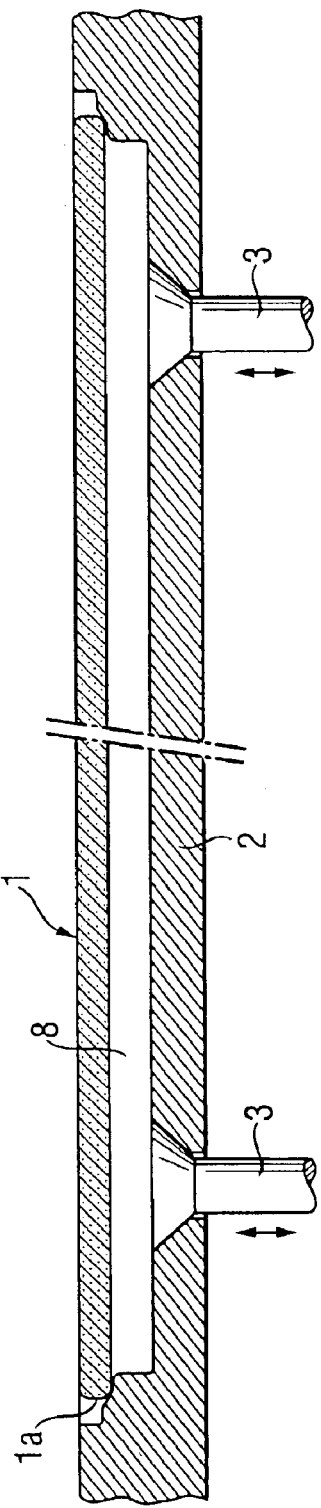

PROCESS AND APPARATUS FOR EPITAXIALLY COATING A SEMICONDUCTOR WAFER AND EPITAXIALLY COATED SEMICONDUCTOR WAFER

BACKGROUND OF THE INVENTION

1. Field of the Invention

The present invention relates to a process and an apparatus for epitaxially coating a semiconductor wafer, and to an epitaxially coated semiconductor wafer.

2. The Prior Art

In semiconductor technology, crystal growth from the vapor phase is used in particular to produce epitaxially coated semiconductor wafers. The term epitaxy is understood as meaning the growth of a single-crystalline layer onto the planar boundary surface of a single-crystalline substrate, generally a substrate wafer, for example a semiconductor wafer. This coating or deposition takes place by means of what is known as chemical vapor deposition (CVD) in CVD reactors, as described for example in EP 714 998 A2. The semiconductor wafer is first of all heated by means of heating sources and then exposed to a gas mixture, referred to below as the process gas, comprising a source gas, a carrier gas and if appropriate a doping gas.

One of the most important applications is the deposition of homoepitaxial layers on single-crystalline silicon substrates, generally silicon wafers. The source gas used is, for example, silanes, such as trichlorosilane, and the carrier gas used is, for example, hydrogen. The doping gases used to dope the epitaxial layer are gaseous compounds, for example from main groups III or V of the periodic system. These compounds, for example phosphine or diborane, decompose, as does the source gas, in the vicinity of the heated wafer. The foreign atoms are then incorporated in the crystal lattice of the epitaxial layer. The semiconductor wafer (substrate wafer) and epitaxial layer are generally differently doped, in order to obtain a sudden transition in the electrical properties. For example, there can be a steep rise in the resistance profile at the transition from the substrate wafer to the epitaxial layer.

During the deposition of the epitaxial layer, there is an undesirable escape of elements which were used for doping the substrate (substrate dopants, for example, in the case of silicon substrates, boron, arsenic, phosphorus or antimony) at the back surface and edge. As a result of diffusion and convection in the reactor, these elements can reach the wafer front surface, where they can be radially inhomogenously incorporated into the epitaxial layer, a phenomenon referred to as autodoping. Autodoping leads to a radial inhomogeneity of the electrical resistivity of the epitaxial layer.

The front and back surface of a semiconductor wafer should be defined at this point. The front surface of the semiconductor wafer is the side which is epitaxially coated and is intended for the fabrication of electronic components.

The prior art has disclosed various processes which counteract autodoping. Thus, by depositing, for example, an oxide layer or a monocrystalline or polycrystalline or amorphous protective layer on the back surface of the semiconductor wafer, it is possible to prevent the outdiffusion of substrate dopant during the epitaxy process.

Drawbacks of the known processes for producing an epitaxially coated semiconductor wafer with a protective layer for suppressing autodoping are the additional process steps which have to be carried out in different reactors, treatment baths and polishing lines. Furthermore, coating with oxide or polycrystalline semiconductor material leads to increased metal contamination.

Therefore, a number of attempts have already been proposed with a view to avoiding autodoping without the wafer back surface being provided with a protective layer prior to the deposition of the epitaxial layer.

WO 01/86034 A2 and WO 01/86035 A1, for example, have disclosed a process for the epitaxial coating of a substrate in wafer form in which the back surface of the substrate does not, as is customary, rest on a susceptor over its entire surface, but rather is exposed to a purge gas, for example hydrogen. The purge gas may be identical to or different than the front surface process gas. Dopant atoms which have diffused out via the wafer back surface are, at least in part, conveyed away by the purge gas. As a result, the proportion of the dopant atoms which diffuse past the edge of the wafer to the wafer front surface and therefore the risk of autodoping are reduced.

A similar process, although not with a view to avoiding autodoping, is described in U.S. Pat. No. 5,960,555. In this case, the object is to counteract deposition of semiconductor material on the wafer back surface. For this purpose, the wafer back surface is purged with a gas which is different than the process gas. The excess pressure prevailing on the back surface leads to the formation of a gentle flow of back surface gas past the wafer edge toward the front surface. This prevents the front surface process gas from penetrating into the back surface space and therefore deposition of semiconductor material on the wafer back surface. Back surface gases used may be inert gases, for example argon, nonreactive gases, such as nitrogen, but also gases such as hydrogen or hydrogen chloride. According to U.S. Pat. No. 5,679,405, it is also possible to use inert gases, such as helium, freon, tetrafluoromethane or hexafluoroethane, to avoid deposition of semiconductor material on the wafer back surface. The prior art does not give any satisfactory solution to the autodoping problem.

SUMMARY OF THE INVENTION

Therefore, it is an object of the present invention to provide a process for depositing an epitaxial layer on a semiconductor wafer which makes it possible to substantially avoid autodoping without the wafer back surface previously being provided with a protective layer.

This object is achieved according to the invention by a process for epitaxially coating the front surface of a semiconductor wafer in a CVD reactor, the front surface of the semiconductor wafer being exposed to a process gas which contains a source gas and a carrier gas, and the back surface of the semiconductor wafer being exposed to a displacement gas, wherein the displacement gas contains no more than 5% by volume of hydrogen, with the result that diffusion of dopants out of the back surface of the semiconductor wafer, which is intensified by hydrogen, is substantially avoided.

According to the invention, during the deposition of the epitaxial layer the front surface and the back surface of the semiconductor wafer are exposed to two different gas atmospheres. The gas which is used on the front surface is referred to below as the process gas and contains a source gas and a carrier gas. In the case of silicon epitaxy, the source gas is generally a silane, for example trichlorosilane, and the carrier gas is generally hydrogen. In addition, the process gas generally contains small quantities of a doping gas.

According to the invention, by contrast, the back surface of the semiconductor wafer is only exposed to gases which are substantially free of hydrogen, i.e. contain no more than 5% by volume, preferably no more than 2% by volume, particularly preferably no more than 0.5% by volume, of hydrogen. With the purity level of technical grade gases which can currently be achieved and with the inclusion of purifiers, it is usually possible to achieve a level of impurity in the back-surface gas in the region of $10^{-7}$% by volume of hydrogen. The gas which is used for the back surface, and is referred to below as the displacement gas, is inert with respect to the deposition reactions. That is it does not undergo any reactions with the carrier gas, the source gas, the doping gas, the semiconductor substrate and/or products of the deposition reaction. The displacement gas used is preferably a noble gas or a mixture of noble gases, argon and helium being particularly preferred.

It has been found that hydrogen plays an important role in autodoping. For example, with boron or arsenic it forms complexes which diffuse rapidly into silicon. In addition, at the temperatures which are customary in epitaxy the hydrogen removes silicon, which additionally liberates dopant. When the wafer back surface comes into contact with hydrogen during the epitaxy process, therefore, the dopant may emerge from the wafer back surface to an increased extent. The dopant can then be conveyed over the wafer edge and incorporated radially inhomogenously in the epitaxial layer on the wafer front surface. If contact between the wafer back surface and hydrogen is avoided, as in the process according to the invention, outdiffusion of dopants and therefore autodoping are substantially suppressed.

By contrast, the processes which are disclosed in WO 01/86034 A2 and WO 01/86035 A1 continue to allow outdiffusion of the substrate dopant, since hydrogen or hydrogen-containing components are permitted for the gas with which the wafer back surface comes into contact. It is merely ensured that the dopants which escape from the back surface are sucked out, in order to reduce the risk of autodoping. In the present invention, the increased outdiffusion of the dopants associated with hydrogen is avoided in the first place.

The undesirable effect of autodoping increases as the permissible resistance inhomogeneity in the epitaxial layer is reduced, as the size of the edge exclusion zone for the resistance measurement decreases and as the difference between the layer and substrate resistivity increases. The resistivities are determined by the level of doping of the substrate or of the epitaxial layer. Particularly for a substrate resistivity of $\leq 100$ mΩcm, preferably <50 mΩcm, particularly preferably <20 mΩcm, and a layer resistivity of >1 Ωcm, preferably >5 Ωcm, particularly preferably >10 Ωcm, it is possible, with the process according to the invention, to produce an epitaxial layer with a radial resistance inhomogeneity of <10%, preferably <5% and particularly preferably <3%. The resistance inhomogeneity is defined in standard ASTM F 1392 in conjunction with ASTM F 81.

Therefore, the invention also relates to a semiconductor wafer having a substrate resistivity of $\leq 100$ mΩcm and having a resistivity of the epitaxial layer of >1 Ωcm, which does not have a back-surface coating, wherein the epitaxial layer has a resistance inhomogeneity of <10%.

Since, according to the invention, the outdiffusion of dopants at the wafer back surface is substantially avoided, the dopant concentration which was originally present in the semiconductor wafer is retained. By contrast, when the process described in WO 01/86034 A2 and WO 01/86035 A1 is used, an outdiffusion profile of the substrate dopant is formed at the wafer back surface: after the epitaxy process, the dopant concentration at the surface of the wafer back surface is relatively low and increases toward the interior of the wafer until it reaches the value which was present originally, i.e. prior to the epitaxy process. The dopant depletion at the wafer back surface has the drawback that the electrical resistance at the back surface is higher than in the remainder of the semiconductor wafer. For example in the case of power components, in which the electric current flows through the substrate, this leads to undesirable power losses as a result of local heating and to the need to dissipate this heat.

These drawbacks are substantially avoided when using the process according to the invention. According to the invention, it is possible to produce a semiconductor wafer with an epitaxial layer which substantially does not have a dopant outdiffusion profile. This can be quantified, for example, by comparing the resistivity at the wafer back surface before and after epitaxy. The lower the degree of dopant outdiffusion at the back surface, the lower the difference between these resistances. Semiconductor wafers which are produced according to the invention are distinguished by the fact that this resistance difference amounts to at most 15%.

Since, in the process according to the invention, no source gas is supplied in the region of the wafer back surface, during the epitaxy process it is impossible for significant amounts of semiconductor material to be deposited on the wafer back surface. Therefore, the formation of what is known as the back surface halo is substantially avoided. The back surface halo is a region at the edge of the wafer back surface which, on account of uneven deposition of semiconductor material during the epitaxy process, has a changed haze. Semiconductor wafers which have been treated in accordance with the invention do not have a back surface halo, since, on account of the absence of hydrogen, there can be no deposition reactions on the wafer back surface.

According to the invention, during the epitaxy process the back surface of the semiconductor wafer is exposed to a gas which contains no more than 5% by volume, preferably no more than 2% by volume, particularly preferably no more than 0.5% by volume, of hydrogen. The process gas which is used for the epitaxial coating of the wafer front surface, however, contains a carrier gas, generally hydrogen. To prevent process gas from coming into contact with the wafer back surface, in the context of the invention it is preferable for the regions of the CVD reactor in which the front surface of the semiconductor wafer, on the one hand, and its back surface, on the other hand, are located to be spatially separated from one another by what are known as "chamber dividers". Possible ways of technically implementing these dividers are given, for example, in WO 01/86035 A1.

To prevent the process gas from penetrating into the back surface gas space and at the same time to ensure that the wafer edge also does not come into significant contact with carrier gas, e.g. hydrogen, a slight excess pressure in the back-surface gas space is preferably ensured. The slight excess pressure leads to a gentle flow of displacement gas beyond the wafer edge into the front-surface gas space. This makes it more difficult for process gas to diffuse toward the back-surface gas space and contributes to keeping the back-surface gas space free of process gas. Moreover, inert displacement gas flows around the wafer edge, so that dopant outdiffusion and deposition at the wafer edge are substantially avoided.

The flow of the displacement gas is preferably set, as a function of the process parameters temperatures, pressures, gas flows and rotational speeds, in such a way that the displacement gas displaces the process gas only at the wafer edge but not at the wafer front surface, and that the wafer does not float. Otherwise, the values which are customary for the corresponding conventional epitaxy process are also used for the process parameters and the gas mixtures (with the exception of the displacement gas).

The flow ratios of the displacement gas are preferably set in such a way that the following boundary conditions are simultaneously fulfilled:

1.) The pressure drop which is formed as a result of the flow of the displacement gas between semiconductor wafer and susceptor generates a force on the semiconductor wafer which counteracts the force of gravity. This force is preferably lower than the force of gravity of the semiconductor wafer.

2.) The flow velocity is preferably high enough at the periphery of the semiconductor wafer for diffusion of hydrogen between semiconductor wafer and susceptor at the wafer edge to be suppressed in such a manner that the hydrogen content between semiconductor wafer and susceptor does not become significant.

The control variables with which the two above conditions can be balanced against one another are (a) the dimension of the free space which for a large part of the wafer area is located between semiconductor wafer and susceptor (from what is known as the pocket to the ring support), (b) the radii of the flow passages or the radius of the flow passage, (c) the volumetric flow of the displacement gas and the temperature which prevails during the epitaxial coating. The settings for the flow of hydrogen at the wafer front surface are of subordinate importance, since the penetration of hydrogen between semiconductor wafer and susceptor is driven substantially by the diffusion of the hydrogen.

To allow displacement gas to be supplied to the wafer back surface, in the context of the invention it is preferable to use a susceptor which leaves a free space (even if only a small one) for gas below a large part of the wafer back surface (from what is known as the pocket to the ring support). There are a number of possibilities for the specific design. Only a few of these are mentioned here by way of example: if a susceptor with only one opening is used, this opening should preferably be located in the center of the susceptor. However, it is also possible to use a susceptor which is provided with a multiplicity of bores and on which the semiconductor wafer rests over its entire surface or just at the edge. Furthermore, it is possible to use a conventional susceptor if the latter has bores, e.g. for what are known as lift pins. In this case, the bores can also be used to supply displacement gas to the wafer back surface through the otherwise continuous susceptor. It is also possible to use an annular support for the semiconductor wafer. The wafer rests on the support only at the edge, while the remainder of the wafer back surface is freely accessible.

BRIEF DESCRIPTION OF THE DRAWINGS

Other objects and features of the present invention will become apparent from the following detailed description considered in connection with the accompanying drawings which disclose several embodiments of the present invention. It should be understood, however, that the drawings are designed for the purpose of illustration only and not as a definition of the limits of the invention.

Preferred embodiments of the susceptors are illustrated in FIGS. 1 to 4:

FIG. 3 shows a preferred embodiment of the edge region of the susceptor; and

FIG. 4 shows a "dish-like" susceptor.

Figure 1:
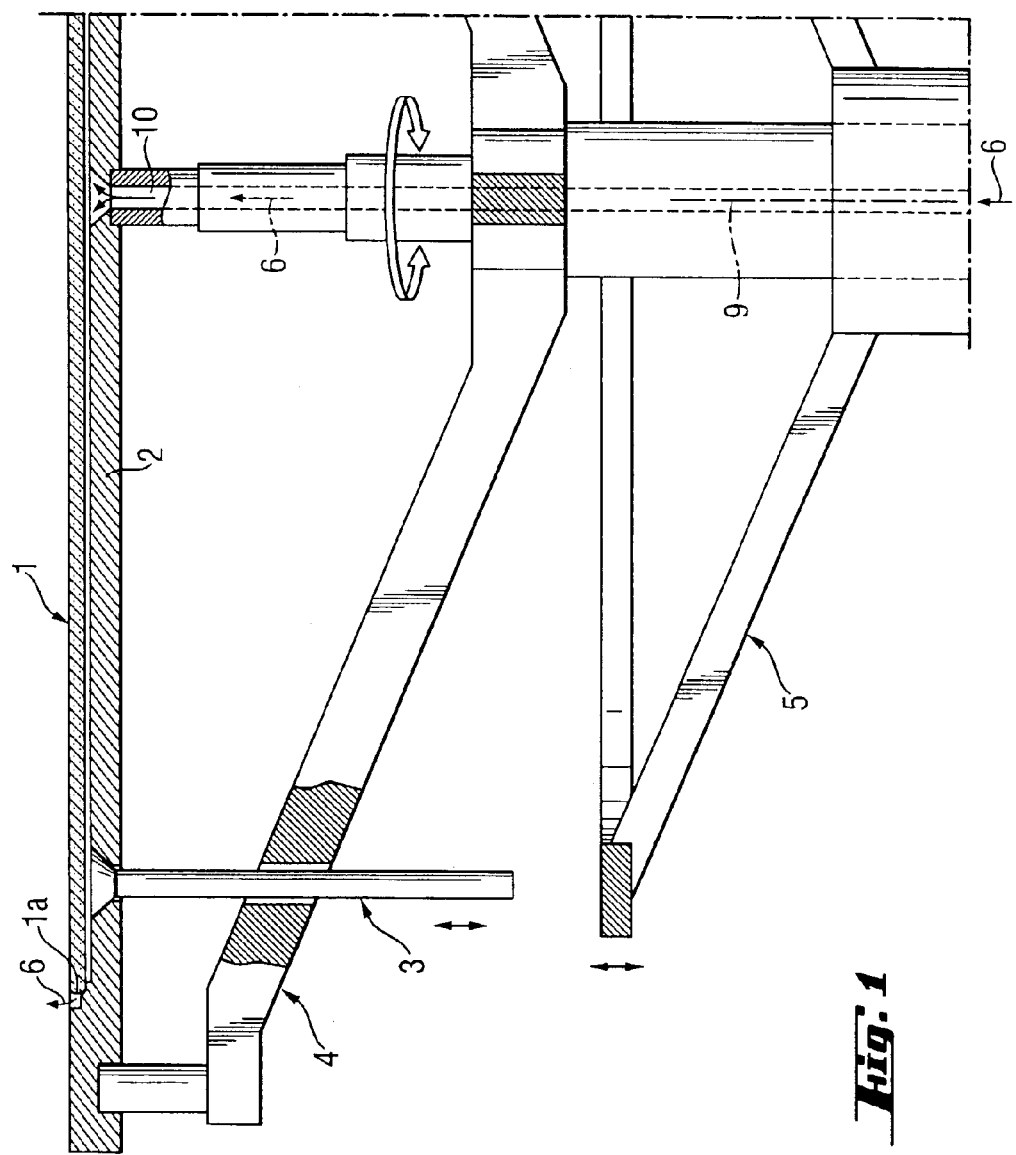
FIG. 1 shows a susceptor in which the displacement gas is passed in via an opening in the center.

Therefore the invention also relates to a susceptor for a CVD reactor, comprising a substantially planar surface, an elevated edge region on which a substrate which is to be treated in the CVD reactor rests, and at least one device for mechanically manipulating the substrate, wherein the device for mechanically manipulating the substrate has at least one opening, through which a gas can be supplied to the back surface of the substrate.

The devices for mechanically manipulating the substrate comprise, for example, the central rotation axis or the lift mechanism. The supply of gas through these distinct locations which are already present on the susceptor has an advantageous effect on the homogeneity of the temperature distribution at the susceptor and therefore at the substrate. Each additional bore in the susceptor adversely affects the homogeneity of the susceptor temperature and therefore the homogeneity of the deposition rate during the epitaxial coating, with adverse effects on the layer thickness homogeneity and the nanotopology. For this reason, it is particularly preferred in the context of the process according to the invention to supply the displacement gas through distinct locations which are already present, such as the rotation axis or lift pins.

In the text which follows, identical reference numerals in the various FIGS in each case relate to identical elements.

DETAILED DESCRIPTION OF PREFERRED EMBODIMENTS

Susceptor in which the displacement gas is supplied via an opening in the center is shown in FIG. 1.

The wafer 1 rests on a susceptor 2. To load the wafer 1 into and out of the reactor, it can be lifted off the susceptor as a result of the wafer lift 5 being raised, with the result that the lift pins 3 (of which only one is shown) and therefore the wafer 1 are lifted. The susceptor is held by a susceptor support 4, which can generally be rotated. In this case, the support 4 is designed in such a way that it is in contact with the susceptor 2 at least in the center. It is now possible to supply a displacement gas 6 through a bore 10 along the central axis 9. The "device for mechanically manipulating the substrate" is in the case the central axis 3 for rotating the susceptor 2 and the substrate.

Figure 2:
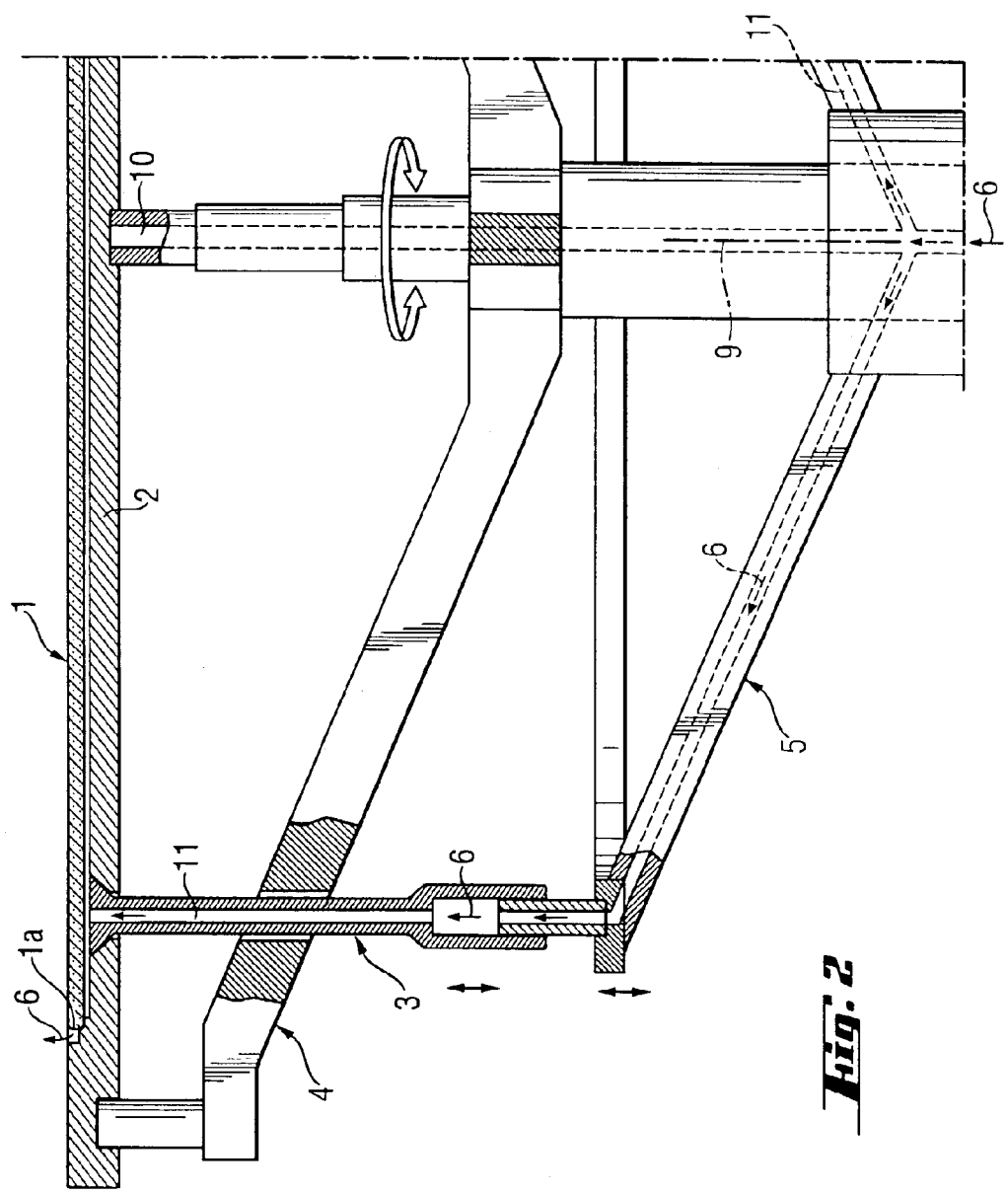
FIG. 2 shows a susceptor in which the displacement gas is supplied via bores in the lift pins.

Susceptor in which the displacement gas is supplied via bores 11 in the lift pins as shown in FIG. 2.

As in FIG. 1, except that in this case the "device for mechanically manipulating the substrate" used for supplying gas is a lift mechanism for raising the substrate 1 off the susceptor 2. The displacement gas 6 is supplied via the wafer lift 5 and the bore 11 in the lift pins 3 (of which only one is shown, by way of example). For illustration purposes, the bore 10 disclosed in FIG. 1 in the center of the susceptor is closed. However, it is also conceivable for the displacement gas to be supplied both via the lift pins 3 and via the susceptor support 4.

Preferred embodiment of the edge region of the susceptor as shown in FIG. 3.

According to a preferred embodiment of the invention, the displacement gas, on account of a slight excess pressure, flows around the wafer edge 1a. On the front surface, the small quantity of displacement gas flowing is mixed and diluted with the carrier gas. A possible further reduction of displacement gas in the region of the front surface after it has flowed around the edge 1a of the wafer 1 can be achieved by passages 7 being arranged in the outer periphery of the susceptor 2, allowing at least a partial flow of the displacement gas into the rear region of the wafer. These passages can be used in combination with each of the preferred embodiments of the susceptor.

"Dish-like" susceptor as shown in FIG. 4.

After the wafer 1 has been placed onto the susceptor 2, a cavity 8 is formed, this cavity being closed apart from possible passages for a lift mechanism, for example lift pins 3.

The images shown are oriented, by way of example, to the design of the lift mechanism and susceptor holder produced by Applied Materials. Possible realizations of susceptors as shown in FIGS. 1 to 4 can, however, also be adapted to systems produced by other manufacturers by means of suitable modifications.

If the process according to the invention, for example on account of the gas flows or the nature of the susceptor used, leads to locally varying deposition rates during the epitaxy process, undesirable effects of this type are preferably compensated for by controlled optimization of the power of the heating sources on the front and back surfaces of the wafer.

In the case of a particularly short process duration, i.e. for example in the case of thin epitaxial layers, a further embodiment of the invention can be used: a "dish-like" susceptor (FIG. 4) with lift mechanism but without bores, apart from those which may be required for producing the lift mechanism, is used, the semiconductor wafer resting on this dish-like susceptor only at the edge. Therefore, there is a closed cavity which is separated from the remainder of the volume of the reactor chamber between the semiconductor wafer and the susceptor. At any desired point prior to the beginning of the deposition of the epitaxial layer, at least that part of the reactor chamber which is connected to the wafer back surface is purged with the displacement gas, with the semiconductor wafer raised, i.e. resting on the lift mechanism. During the purging or thereafter, the lift mechanism is lowered, the semiconductor wafer is placed onto the edge of the susceptor and as a result some of the displacement gas is enclosed in the cavity between the dish-like susceptor and the semiconductor wafer.

The purging step may take place as early as before or during any pretreatment of the semiconductor wafer, for example a thermal pretreatment and/or a vapor-phase etch or also between any pretreatment and the actual deposition. The purging step may affect either the entire reactor chamber or only a part, for example separated off by chamber dividers, of the reactor chamber, although this part must include the gas space on the back surface of the semiconductor wafer. It is only important for the semiconductor wafer already to be resting on the edge of the susceptor when the deposition of the epitaxial layer commences, so that there can substantially no longer be any gas exchange between the enclosed cavity and the remainder of the reactor chamber.

Then, process gas is introduced into the reactor chamber and the epitaxial coating of the wafer front surface is carried out. Furthermore, the back surface of the semiconductor wafer comes into contact only with the enclosed displacement gas. In this embodiment, it is sufficient for only the losses of displacement gas which are caused by points in the cavity which are not sealed, for example the bores for the lift pins, to be compensated for. These losses are compensated for by a controlled supply of displacement gas into the cavity. However, it is particularly preferable for the cavity between wafer back surface and dish-like susceptor to be made substantially sealed, so that it is possible to dispense with a supply of displacement gas into the cavity during the epitaxy process. Then, only process gas is supplied during the epitaxy process. However, the entire process may at most lead to an enrichment of 5% by volume of hydrogen in the cavity between the wafer back surface and the susceptor, and consequently this embodiment can be employed advantageously in particular for very short epitaxy processes.

The process for producing an epitaxial layer on a semiconductor substrate may, in addition to the actual deposition, comprise further steps for pretreatment and aftertreatment (e.g. bake, vapor-phase etch) and any desired purging steps. In the treatments and the purging steps it is possible for either the entire volume of the reactor chamber or only certain parts, which are separated from the remainder of the volume of the reactor chamber by chamber dividers, to be exposed to the displacement gas. The extent to which the front surface can be exposed to the displacement gas is dependent in particular on the treatment step. However, it is also preferable for the wafer back surface to be acted on by the displacement gas during the pretreatment and aftertreatment. As a result, by way of example, contact of the wafer back surface with hydrogen during the bake or with etching gas during the vapor phase etch is substantially avoided. This has a number of advantages:

Firstly, even during the pretreatment increased outdiffusion of dopants on the wafer back surface and in the region of the wafer edge through contact with hydrogen is prevented. Secondly, contact of the wafer back surface and the wafer edge with etching gas during the vapor phase etch is avoided, which contact would lead to inhomogenous removal of semiconductor material and would therefore contribute to the formation of the back-surface halo. Moreover, the susceptor is prevented from being chemically attacked by the etching gas, which would require the susceptor to be reworked or exchanged from time to time. The preferred embodiment of the invention described therefore leads to an increase in the service life of the susceptor.

EXAMPLE

A silicon wafer with a diameter of 300 mm and a resistivity of 10 mΩcm was homoepitaxially coated in an epitaxy reactor at 1100° C. During the coating, the silicon wafer was rotated about its center axis at 32 revolutions per minute. The flow of hydrogen was 50 slm (standard liters per minute), the flow of trichlorosilane was 17 slm and the flow of diborane was 150 sccm (standard cubic centimeters per minute). Under these conditions, a 3 μm thick, boron-doped silicon layer with a resistivity of 5 Ωcm was deposited. According to the invention, argon was supplied during the epitaxial coating below the center of the silicon wafer, as shown in FIG. 1. The radius of, the feed was 1 cm. The recess in the susceptor (pocket) was designed in such a way that the distance between wafer back surface and the lowest point of the susceptor was 0.5 mm. The argon flowed in below the silicon wafer at a volumetric flow rate of 180 sccm. Under these conditions, a radial resistance variation on the front surface of the epitaxially coated silicon wafer of <5% was achieved.

The invention can be used in the context of the epitaxial coating of semiconductor wafers, preferably of silicon wafers with a diameter of ≦100 mm. The epitaxial coating may take place at atmospheric pressure or reduced pressure. However, it is also possible to apply the principle as part of other single-wafer processes which deposit or remove, i.e. etch, material on one side and in which a carrier gas is required by the deposition or etching chemistry.

Accordingly, while a few embodiments of the present invention have been shown and described, it is to be understood that many changes and modifications may be made thereunto without departing from the spirit and scope of the invention as defined in the appended claims.

What is claimed is:

1. A process for epitaxially coating a front surface of a semiconductor wafer in a CVD reactor, comprising
   exposing the front surface of the semiconductor wafer to a process gas which contains a source gas and a carrier gas; and
   exposing a back surface of the semiconductor wafer to a displacement gas, wherein the displacement gas contains no more than 5% by volume of hydrogen;
   with the result that diffusion of dopants out of the back surface of the semiconductor wafer, which is intensified by hydrogen, is substantially avoided.

2. The process as claimed in claim 1,
   wherein the semiconductor wafer, prior to a deposition of an epitaxial layer, is subjected to at least one pretreatment step in the CVD reactor, at least the back surface of the semiconductor wafer being exposed to a displacement gas which contains no more than 5% by volume of hydrogen.

3. The process as claimed in claim 1,
   wherein the semiconductor wafer, after a deposition of an epitaxial layer, is subjected to at least one aftertreatment step in the CVD reactor, and
   exposing at least the back surface of the semiconductor wafer to a displacement gas which contains no more than 5% by volume of hydrogen.

4. The process as claimed in claim 1,
   wherein the displacement gas is under a higher pressure than the process gas, and wherein as a result a gas flow out of a region of the back surface of the semiconductor wafer into a region of the front surface of the semiconductor wafer is formed.

5. The process as claimed in claim 1,
   wherein the semiconductor wafer rests on a lift mechanism, while at least that part of the CVD reactor which is connected to the back surface of the semiconductor wafer is purged with displacement gas, wherein the lift mechanism is then lowered, so that the back surface of the semiconductor wafer is placed onto a dish-like susceptor, an edge of the semiconductor wafer ending substantially tightly with the dish-like susceptor, so that a cavity filled with displacement gas remains between the dish-like susceptor and the back surface of the semiconductor wafer, and
   then exposing the front surface of the semiconductor wafer to a process gas, in order to deposit an epitaxial layer.

6. The process as claimed in claim 1,
   wherein a starting material used is a semiconductor wafer with a resistivity of ≦100 mΩcm.

7. The process as claimed in claim 1,
   wherein an epitaxial layer with a resistance of >1 Ωcm is deposited.

8. The process as claimed in claim 1,
   wherein the displacement gas is inert with respect to deposition reactions.

9. The process as claimed in claim 8,
   wherein the displacement gas is a noble gas or a mixture of noble gases.

* * * * *